United States Patent
Tseng et al.

(10) Patent No.: US 12,340,830 B2
(45) Date of Patent: Jun. 24, 2025

(54) SPIN-ORBIT TORQUE MAGNETIC RANDOM ACCESS MEMORY CIRCUIT AND LAYOUT THEREOF

(71) Applicant: UNITED MICROELECTRONICS CORP., Hsin-Chu (TW)

(72) Inventors: Chun-Yen Tseng, Tainan (TW); Yu-Tse Kuo, Tainan (TW); Shu-Ru Wang, Taichung (TW); Jen-Yu Wang, Tainan (TW); Li-Ping Huang, Miaoli County (TW); Yi-Ting Wu, Tainan (TW); Jia-Rong Wu, Kaohsiung (TW); Chun-Hsien Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 525 days.

(21) Appl. No.: 17/707,934

(22) Filed: Mar. 29, 2022

(65) Prior Publication Data
US 2023/0282261 A1    Sep. 7, 2023

(30) Foreign Application Priority Data
Mar. 4, 2022    (CN) .......................... 202210207577.4

(51) Int. Cl.
| | |
|---|---|
| *G11C 11/00* | (2006.01) |
| *G11C 11/16* | (2006.01) |
| *H10B 61/00* | (2023.01) |
| *H10N 50/10* | (2023.01) |
| *H10N 50/80* | (2023.01) |

(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01); *H10B 61/22* (2023.02); *H10N 50/10* (2023.02); *H10N 50/80* (2023.02)

(58) Field of Classification Search
CPC ..... G11C 11/16; G11C 11/161; G11C 11/165; G11C 11/1653; G11C 11/1655; G11C 11/1657
USPC ......................................................... 365/158
See application file for complete search history.

(56) References Cited

U.S. PATENT DOCUMENTS

| | | | |
|---|---|---|---|
| 10,483,457 B1 * | 11/2019 | Lee ......................... | H10N 50/10 |
| 11,688,445 B2 * | 6/2023 | Thirumala .......... | G11C 11/1673 |
| | | | 365/158 |

(Continued)

OTHER PUBLICATIONS

Liao ,"Benchmarking and Optimization of Spintronic Memory Arrays" IEEE Journal on Exploratory Solid-State Computational Devices and Circuits, vol. 6, No. 1, Jun. 1, 2020.

*Primary Examiner* — Tha-O H Bui
(74) *Attorney, Agent, or Firm* — Winston Hsu

(57) ABSTRACT

The present invention provides a spin-orbit torque magnetic random access memory (SOT-MRAM) circuit, including a read transistor pair with two read transistors in parallel, a write transistor pair with two write transistors in parallel, a SOT memory cell with a magnetic tunnel junction (MTJ) and a SOT layer, wherein one end of the MTJ is connected to the source of the read transistor pair and the other end of the MTJ is connected to the SOT layer, and one end of the SOT layer is connected to a source line and the other of the SOT layer is connected to the source of the write transistor pair, a read bit line is connected to the drain of the read transistor pair and a write bit line is connected to the drain of the read transistor.

6 Claims, 7 Drawing Sheets

(56) References Cited

U.S. PATENT DOCUMENTS

| | | | |
|---|---|---|---|
| 2019/0334080 A1* | 10/2019 | Ahmed | H10N 50/01 |
| 2020/0135804 A1* | 4/2020 | Luo | H10N 50/10 |
| 2020/0350364 A1* | 11/2020 | Wan | H10B 61/22 |
| 2022/0285609 A1* | 9/2022 | Huang | H10N 52/01 |

* cited by examiner

|  | write 0 | write 1 | read |
|---|---|---|---|
| WL1/WL2 | VDD | VDD | VDD |
| BLw | VDD | 0 | 0 |
| BLr | Hiz | Hiz | VDD |
| SL | 0 | VDD | 0 |
| SA | off | off | on |

SPIN-ORBIT TORQUE MAGNETIC RANDOM ACCESS MEMORY CIRCUIT AND LAYOUT THEREOF

BACKGROUND OF THE INVENTION

1. Field of the Invention

The present invention relates generally to a spin-orbit torque magnetic random access memory (SOT-MRAM) circuit and layout thereof, and more specifically, to a 4T1M (four transistors and one memory unit) SOT-MRAM circuit and layout thereof

2. Description of the Prior Art

Magnetic random access memory (MRAM) is considered to be a promising and emerging memory in the future of memory industry due to its fast read/write speeds, non-volatility and integratability with semiconductor process. Start from early magnetic field operation to recent commercially produced spin-transfer torque (STT) type, and further to current spin-transfer orbit (SOT) type researched and developed actively in the industry, the operation model of MRAM evolves correspondingly from indirectly application of magnetic field through current to directly granting temporal pulses for fast read/write operation.

As far as spin-orbit torque magnetic random access memory (SOT-MRAM) is concerned, since its architecture of read/write splitting three-terminals design, the current applied in write operation doesn't need to pass through magnetic tunnel junction, so that the tolerance and reliability of memory device may be improved. However, the adopting of three-terminal architecture results in more components required to be set on the layout area of the SOT-MRAM. Therefore, it is essential to improve the layout design in the development of SOT-RMAM technology in order to reduce required layout area. Regarding this, the approach of common word line or common bit line (read/write circuit lines shared by transistors) is adopted in conventional skill. Nevertheless, these approaches have existing disadvantages, for example, requiring additional isolating word lines or the gate widths of read/write active areas have to be the same. Besides, current SOT-MRAM design has quite low current efficiency. It may need to apply higher operating current in comparison to ordinary memory, which is also disadvantageous to the miniaturization of the device in the future. Therefore, those of skilled in the art still need to improve the layout structure of current SOT-MRAM in order to solve the issue of inefficient current usage due to the aforementioned structural design.

SUMMARY OF THE INVENTION

In the light of the aforementioned disadvantages in conventional skills, the present invention hereby provides a novel spin-orbit torque magnetic random access memory (SOT-MRAM) circuit and layout thereof, with features of adopting 4T1M (four transistors and one memory unit) architecture having two read transistors and two write transistor connected in pair and in parallel, so that the memory unit may receive double operating current. In addition, the read/write active areas may have different widths and need not to form additional isolating word lines.

One aspect of the present invention is to provide a spin-orbit torque magnetic random access memory circuit, with structures including a read transistor pair having two read transistors in parallel, a write transistor pair having two write transistors in parallel, a spin-orbit torque magnetic random access memory unit with a magnetic tunnel junction and a spin-orbit torque layer, wherein one end of the magnetic tunnel junction is connected to a source of the read transistor pair and the other end of the magnetic tunnel junction is connected to the spin-orbit torque layer, and one end of the spin-orbit torque layer is connected to a source line and the other end of the spin-orbit torque layer is connected to a source of the write transistor pair, a read bit line connected to a drain of the read transistor pair, a write bit line connected to a drain of the write transistor pair, a first word line connected to a gate of one of the read transistor and a gate of one of the read transistor, and a second word line connected to a gate of another the read transistor and a gate of another the read transistor.

Another aspect of the present invention is to provide a spin-orbit torque magnetic random access memory layout, including a substrate with a read active area and a write active area formed thereon, a first word line and a second word line both extending through the read active area and the write active area and dividing the read active area into a first drain and a second drain at two sides and a first common source in the middle and dividing the write active area into a third drain and a fourth drain at two sides and a second common source in the middle, a read bit line on the read active area and connected with the first drain and the second drain, so that the first drain, the second drain, the first common source, the first word line and the second word line collectively constitute a read transistor pair having two read transistors in parallel, a write bit line on the write active area and connected with the third drain and the fourth drain, so that the third drain, the fourth drain, the second common source, the first word line and the second word line collectively constitute a write transistor pair having two write transistors in parallel, a magnetic tunnel junction on the first common source and connected with the first common source, and a spin-orbit torque layer on the magnetic tunnel junction and connected with the magnetic tunnel junction, and two ends of the spin-orbit torque layer are connected respectively with the second common source and a source line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
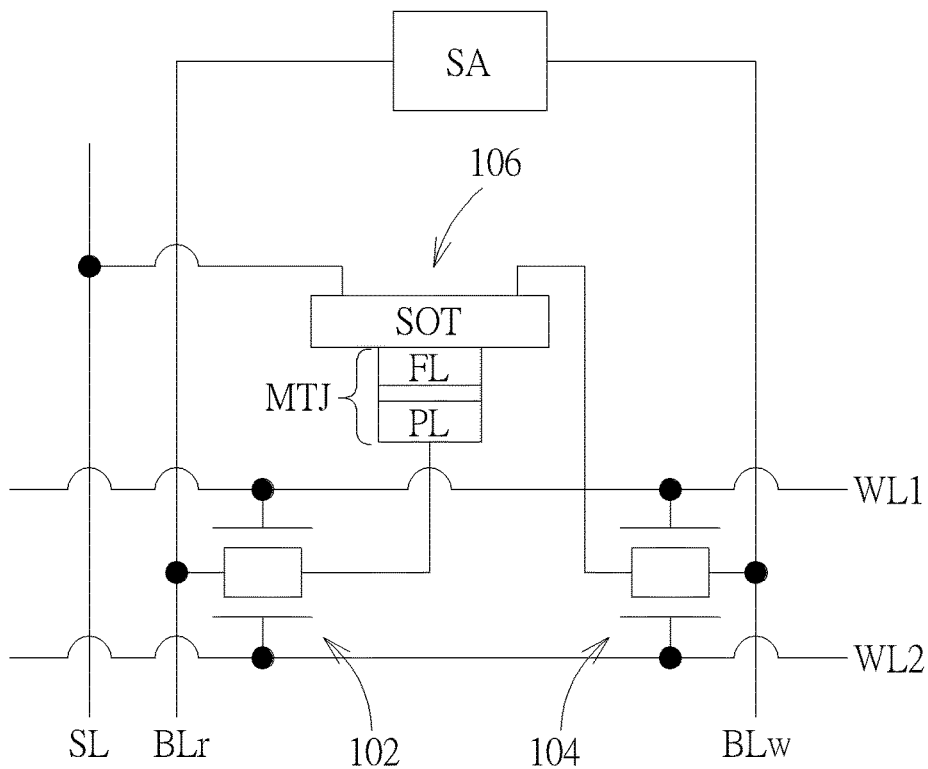
FIG. 1 is a schematic circuit diagram of a spin-orbit torque magnetic random access memory (SOT-MRAM) in accordance with one preferred embodiment of the present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

First, please refer to FIG. 1, which is a schematic circuit diagram of a spin-orbit torque magnetic random access memory (SOT-MRAM) in accordance with one preferred embodiment of the present invention. The SOT-MRAM circuit of the present invention is composed of three main components, i.e. a read transistor pair 102, a write transistor pair 104 and a SOT-MRAM unit 106, which constitute the 4T1M (four transistors and one memory unit) MRAM architecture of the present invention, wherein the read transistor pair 102 consists of two read transistors connected in parallel and the write transistor pair 104 consists of two write transistors connected in parallel, and the SOT-MRAM unit 106 consists of a magnetic tunnel junction MTJ and a spin-orbit torque layer SOT. In the aspect of connection, one end of the magnetic tunnel junction MTJ of the SOT-MRAM unit 106 is connected to source of the read transistor pair 102 and the other end is contacted directly with the spin-orbit torque layer SOT. One end of the spin-orbit torque layer SOT is connected to a source line SL and the other end is connected to source of the write transistor pair 104. The drain of read transistor pair 102 is connected to a read bit line BLr, and the drain of write transistor pair 104 is connected to a write bit line BLw. One of the gates of the read transistor pair 102 and one of the gates of the write transistor pair 104 are connected to a common first word line WL1, and the other gate of the read transistor pair 102 and the other gate of the write transistor pair 104 are connected to a common second word line WL2. In addition, the read bit line BLw and the write bit line BLw are both connected to a sense amplifier SA.

In the aspect of structure, the magnetic tunnel junction MTJ may consist of one pinned layer PL and one free layer FL. The material of pinned layer PL may be ferromagnetic material, which includes but not limited to iron (Fe), cobalt (Co), nickel (Ni) or the alloy thereof like CoFeB or CoFe. Alternatively, the pinned layer PL may be made of antiferromagnetic (AFM) material, which includes but not limited to FeMn, PtMn, IrMn, NiO or the combination thereof. The function of pinned layer PL is to fix or limit the directions of magnetic moment of adjacent layer structures, so that they will not be flipped by external magnetic field. The material of free layer FL may be ferromagnetic material, which includes but not limited to Fe, Co, Ni or the alloy thereof like CoFeB or CoFe. The magnetic moment of the free layer FL may be freely flipped and altered through external electric field. When the magnetization directions of the pinned layer PL and the free layer 114 are the same, the spin directions of a majority of electrons in the two ferromagnetic materials are the same, so that they will have higher tunneling probability, thereby having larger tunneling current and the magnetic tunnel junction MTJ will be rendered in low-resistance state ("0" bit). Conversely, the magnetic tunnel junction MTJ will be rendered in high-resistance state ("1" bit). Furthermore, the material of spin-orbit torque layer SOT may include tungsten (W). In the present invention, spin moment may be generated by spin Hall effect (SHE) when current flows through the spin-orbit torque layer SOT, so as to alter the magnetic moment of magnetic materials in the magnetic tunnel junction MTJ. This is principle how to achieve data storage by MRAM through the approach of altering the spin direction of electrons to change the electrical resistance.

Figure 2:
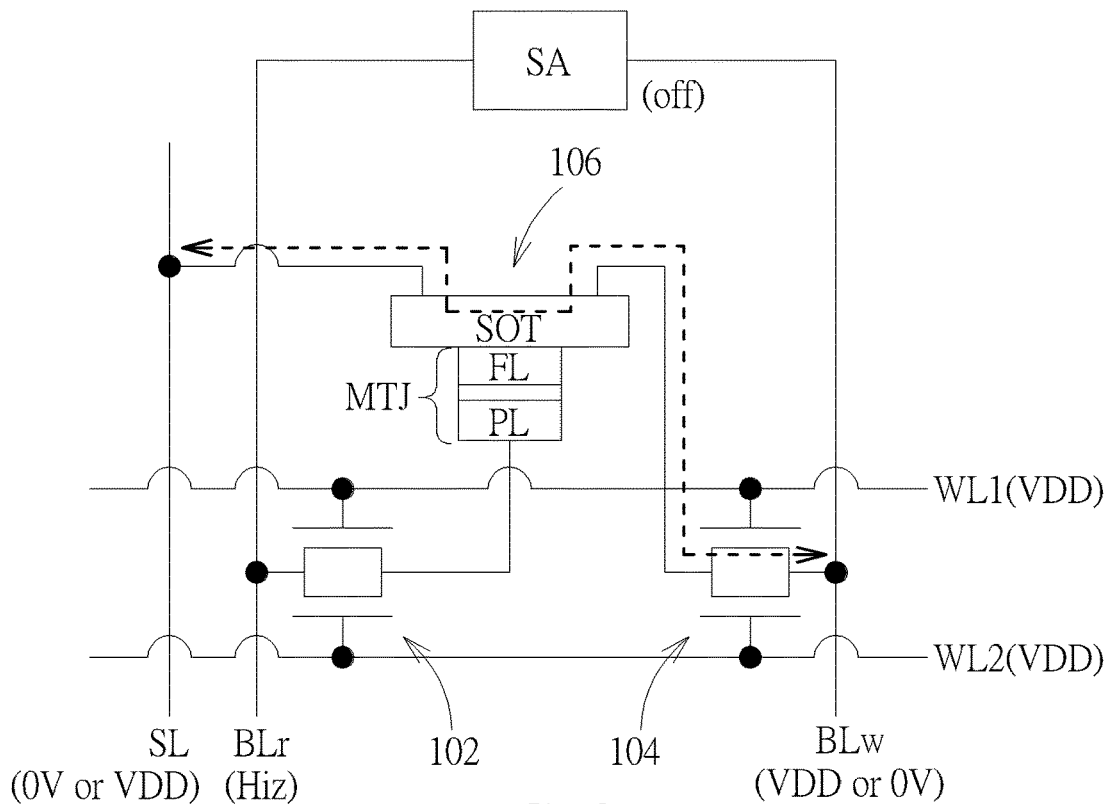
FIG. 2 is a schematic circuit diagram of the SOT-MRAM in write operation in accordance with one preferred embodiment of the present invention.
Figures 3, 4:
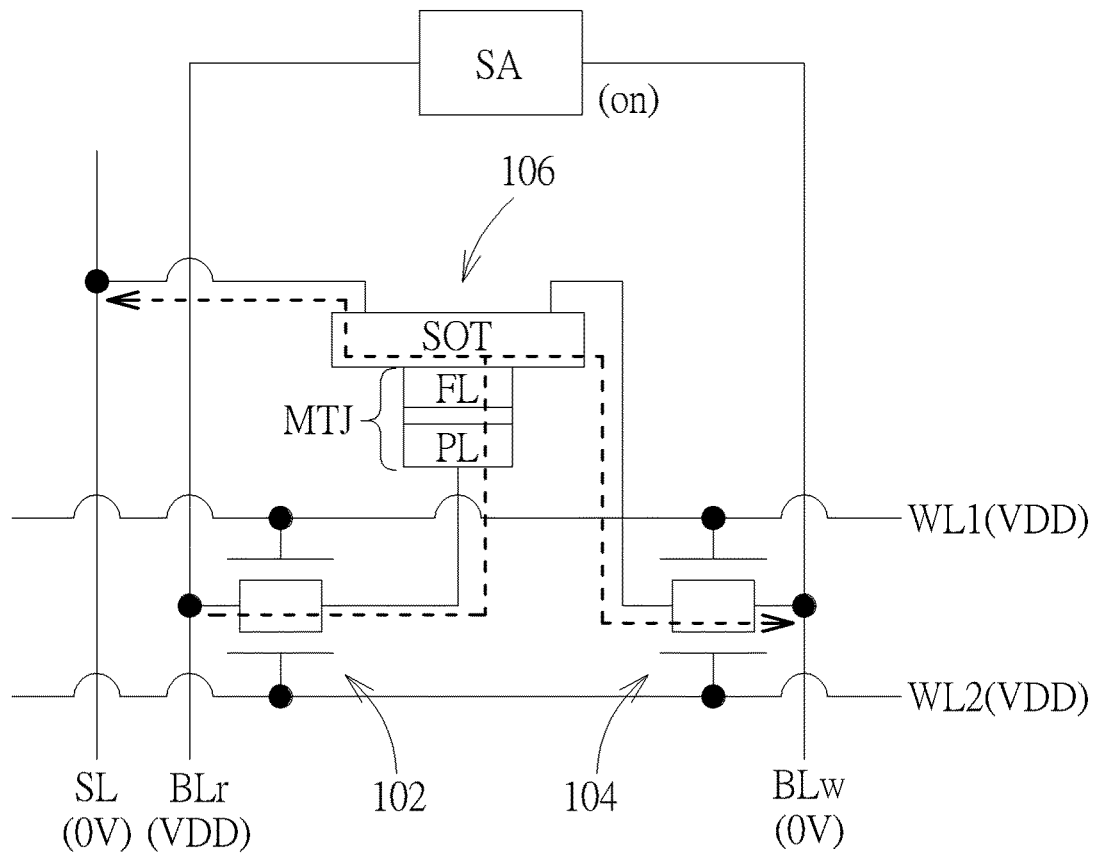
FIG. 3 is a schematic circuit diagram of the SOT-MRAM in read operation in accordance with one preferred embodiment of the present invention.
FIG. 4 is a table list of applied voltages in different circuit lines in read operation and write operation of the SOT-MRAM in accordance with one preferred embodiment of the present invention.

Please refer now to FIG. 2, which is a schematic circuit diagram of the SOT-MRAM in the write operation in accordance with one preferred embodiment of the present invention, and may also refer collectively to the table list of applied voltages in different circuit lines in the write operation of the SOT-MRAM in FIG. 4. In the operation of writing low logic state "0" data in the SOT-MRAM of the present invention, an operating voltage VDD is applied from the first word line WL1 and the second word line WL2 to open the transistors in the read transistor pair 102 and the write transistor pair 104, and an operating voltage VDD is applied from the write bit line BLw to the grounded source line SL (0V) sequentially through the opened write transistor pair 104 and the spin-orbit torque layer SOT, while the read bit line BLr is in high-resistance state (Hiz). At this time, no current will flow through the magnetic tunnel junction MTJ and the read bit line BLr. The applied current will alter the magnetic moment of magnetic materials in the magnetic tunnel junction MTJ in the aforementioned process of flowing though the spin-orbit torque layer SOT and render it in low-resistance state ("0" bit). The sense amplifier SA in this write process is in OFF state. This is the operation of writing low logic state "0" data in the present invention.

On the other hand, refer still to FIG. 2 and FIG. 4. In the operation of writing high logic state "1" data in the SOT-MRAM of the present invention, similarly, an operating voltage VDD is applied from the first word line WL1 and the second word line WL2 to open the transistors in the read transistor pair 102 and the write transistor pair 104, but an operating voltage VDD is applied instead from the source line SL to the grounded write bit line BLw (0V) sequentially through the spin-orbit torque layer SOT and the opened write transistor pair 104, while the read bit line BLr is in high-resistance state (Hiz). At this time, no current will flow through the magnetic tunnel junction MTJ and the read bit line BLr. The applied current will alter the magnetic moment of magnetic materials in the magnetic tunnel junction MTJ in the aforementioned process of flowing though the spin-orbit torque layer SOT and render it in high-resistance state ("1" bit). The sense amplifier SA in this write process is in OFF state. This is the operation of writing high logic state "1" data in the present invention.

Please refer now to FIG. 3, which is a schematic circuit diagram of the SOT-MRAM in the read operation in accordance with one preferred embodiment of the present invention, and may also refer collectively to the table list of applied voltages in different circuit lines in the read operation of the SOT-MRAM in FIG. 4. In the read operation of the SOT-MRAM of the present invention, an operating voltage VDD is applied from the first word line WL1 and the second word line WL2 to open the transistors in the read transistor pair 102 and the write transistor pair 104, and an operating voltage VDD is applied from the read bit line BLr to the grounded source line SL and write bit line BLw (OV) sequentially through the opened read transistor pair 102, the magnetic tunnel junction MTJ and the spin-orbit torque layer SOT. In this process, the sense amplifier SA will be turn ON so that it may receive currents from the read bit line BLr and the write bit line BLw. The resistance of the magnetic tunnel junction MTJ may be obtained through the measured current value, thereby further obtaining its logic state.

After explaining the circuit structure of the present invention, the following embodiments will explain layouts of the SOT-MRAM in different levels in accordance with one preferred embodiment of the present invention, which may help readers further understand the relative positions and connections of the components in the SOT-MRAM structure of present invention.

Figure 5:
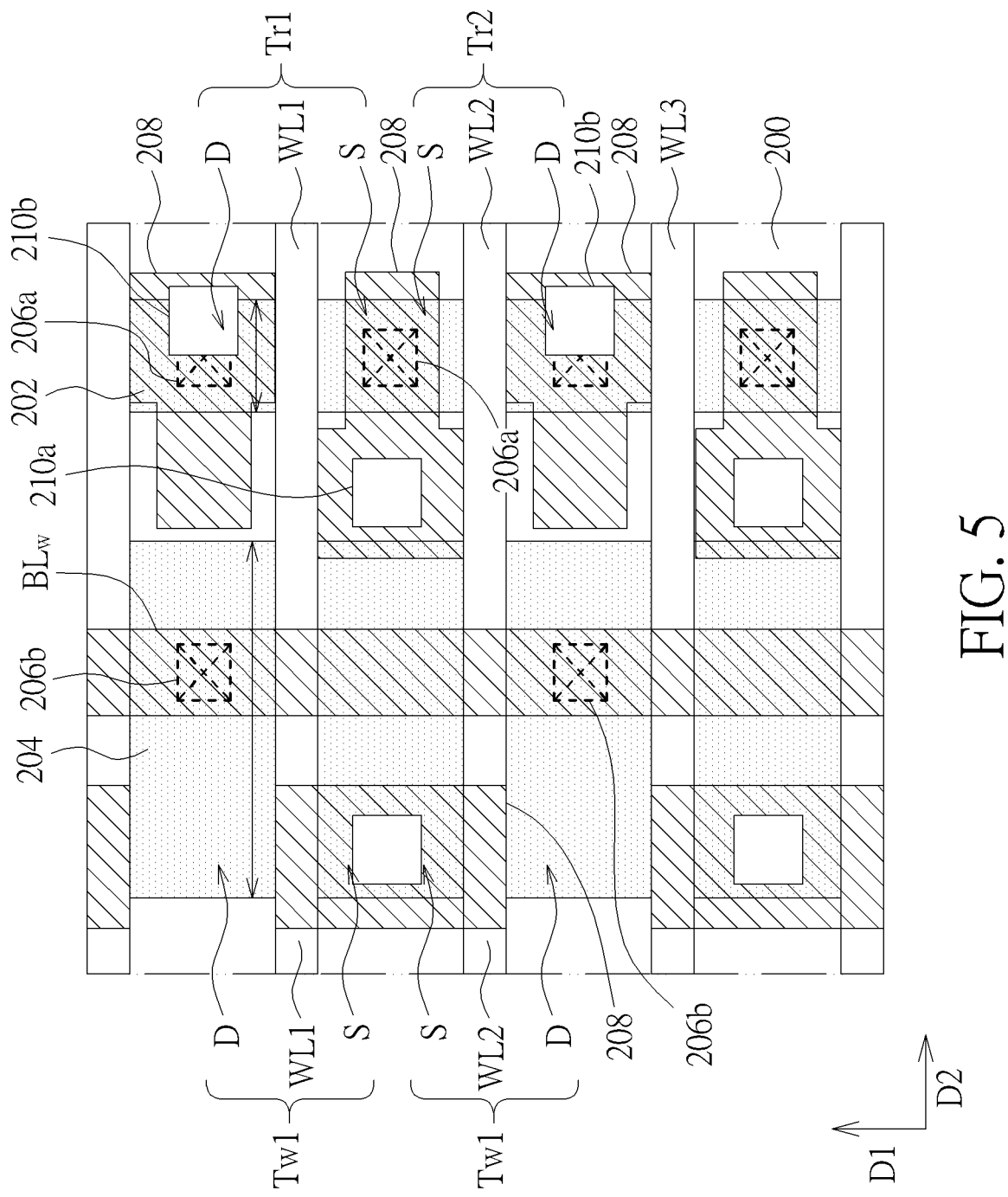
FIGS. 5-9 are layouts of the SOT-MRAM in different levels in accordance with one preferred embodiment of the present invention.

Please refer first to FIG. 5. The SOT-MRAM of present invention is manufactured on a substrate 200. The substrate 200 may include a wide array of semiconductor materials, such as silicon (Si), germanium (Ge), gallium arsenide (GaAs), indium phosphide (InP), but not limited thereto. A read active area 202 and a write active area 204 are formed on the substrate 200 through doping dopants into the substrate 200 by ion implantation processes. As shown in FIG. 5, in the preferred embodiment of the present invention, the read active area 202 and the write active area 204 extend in a first direction D1 and space apart from each other at a distance, and since the write operation of the MRAM requires larger current, the width w1 of the write active area 204 in a second direction D2 perpendicular to the first direction D1 is designedly larger than the width w2 of the read active area 202 in the second direction D2. Multiple word lines WL1~WL3 are set on the substrate 200, extend in the second direction D2 and space apart from each other. The word lines WL1~WL3 extend across the read active area 202 and the write active area 204, wherein each word line WL1~WL3 and the passed read active areas 202 at two sides of it constitute a read transistor, and each word line WL1~WL3 and the passed write active areas 204 at two sides of it constitute a write transistor.

For example, the word line WL1 and the source S and drain D at two sides of the read active area 202 constitute a read transistor Tr1, the word line WL2 and the source S and drain D at two sides of the read active area 202 constitute a read transistor Tr2, the word line WL1 and the source S and drain D at two sides of the write active area 204 constitute a write transistor Tw1, and the word line WL2 and the source S and drain D at two sides of the write active area 204 constitute a write transistor Tw2. The word lines WL1, WL2 function as gates of the aforementioned transistors. It can be seen in the figure that the read transistors Tr1, Tr2 share a source S, and their drains are also connected to a common read bit line above (will be described and shown in figures later) through interconnect structures like contacts and metal interconnection layers. Therefore, in the embodiment of present invention, the read transistors Tr1, Tr2 are connected in parallel into a read transistor pair (i.e. 102 in FIG. 1). Similarly, the write transistors Tw1, Tw2 share a source S, and their drains are also connected to a common write bit line BLw above through contacts 206b. Therefore, in the embodiment of present invention, the write transistors Tw1, Tw2 are connected in parallel into a write transistor pair (i.e. 104 in FIG. 1).

Refer still to FIG. 5. What above the word lines WL1~WL3 are the metal interconnect structures formed in CMOS BEOL (back-end-of-line) process, such as contacts 206a, 206b, first metal layer (M1) 208 and vias 210a~210c. In the embodiment, the sources S and drains D of the read transistors Tr1, Tr2 are all connected to a first metal layer (metal island) 208 above through contacts 206a. The sources S of write transistors Tw1, Tw2 are also connected to the first metal layers 208 above through contacts (which overlap the patterns of vias 210c formed thereon), however, their drains are connected to a common write bit line BLw above through contacts 206b. Vias are set on the aforementioned first metal layer 208 to further connect the structures in upper levels, such as second metal layer (M2). It can be seen in the figure that vias 210a, 210b on the read transistors Tr1, Tr2 are in staggered arrangement in the first direction D1, wherein the vias 210b for connecting the drain D overlap the underlying read active area 202, while the vias 210a for connecting the source S are set at positions between the read active area 202 and write active area 204. In this embodiment, the write bit line BLw are also in the level of first metal layer 208, and extends in the first direction D1 and overlap the underlying write active area 204.

Figure 6:
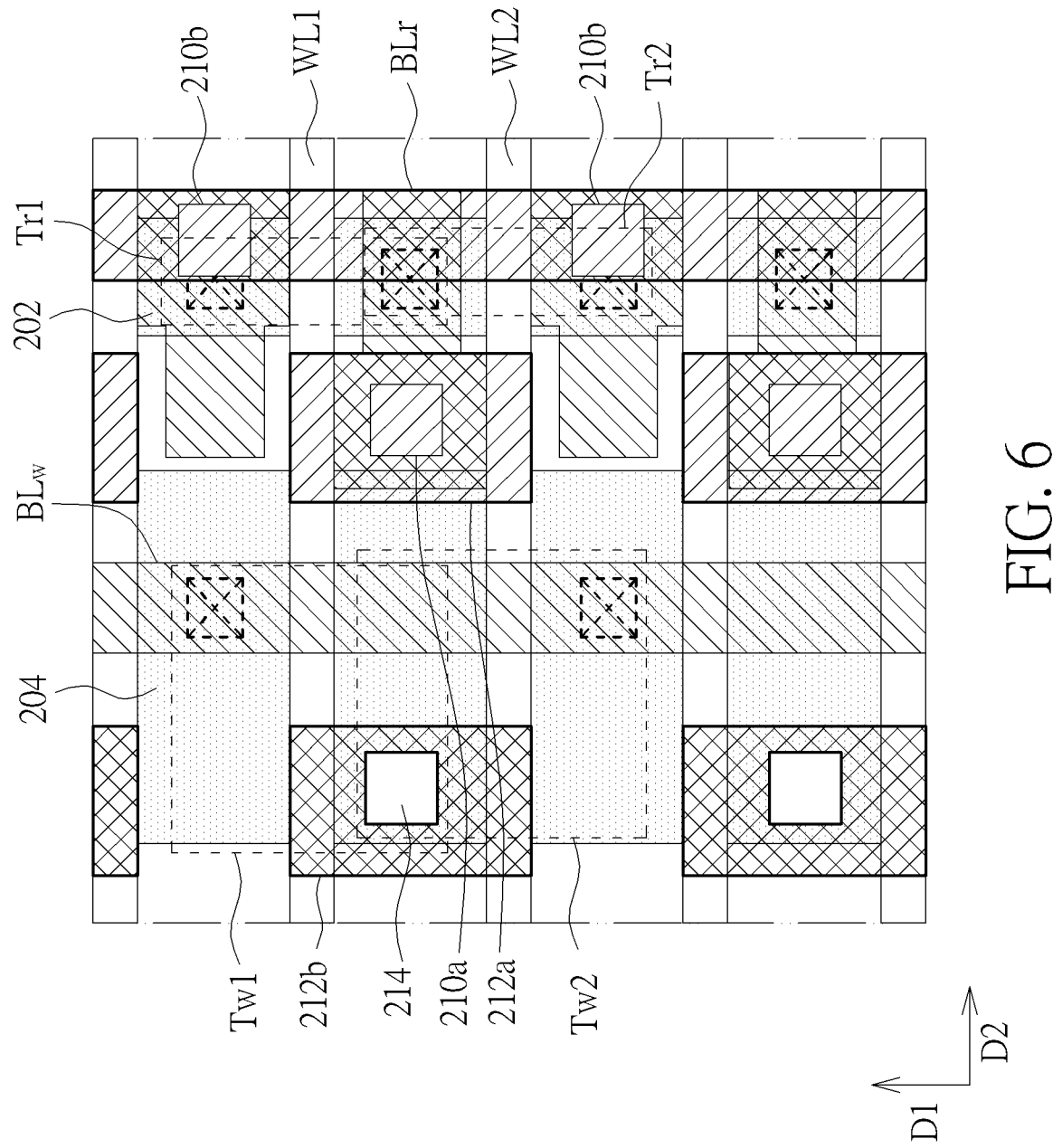

Please refer now to FIG. 6. The aforementioned vias (V1) 210a~210c will be connected to overlying second metal layer (M2, metal islands) or the read bit line. As shown in FIG. 6, the via 210a on the common source of the read transistors Tr1, Tr2 connects to a second metal layer 212a above, while the via 210b on the drain connects to a common read bit line BLr above, so as to achieve the effect of connecting the read transistors Tr1, Tr2 in parallel. The via (which overlaps the pattern of via 214 thereon) on the common source of the write transistors Tw1, Tw2 connects to a second metal layer 212b above. In the embodiment of present invention, the read bit line BLr extends in the first direction and partially overlaps the read active area 202 below, and it is in the same level as the second metal layers 212a, 212b. The second metal layer 212a is roughly between the read active area 202 and the write active area 204, the second metal layer 212b roughly overlaps the write active area 204, and the second metal layer 212a and the second metal layer 212b are symmetric in the second direction D2 with respect to the write bit line BLw below, wherein via 214 is set on the second metal layer 212b to further connect to structures in upper layers, such as the third metal layer (M3).

Figure 7:
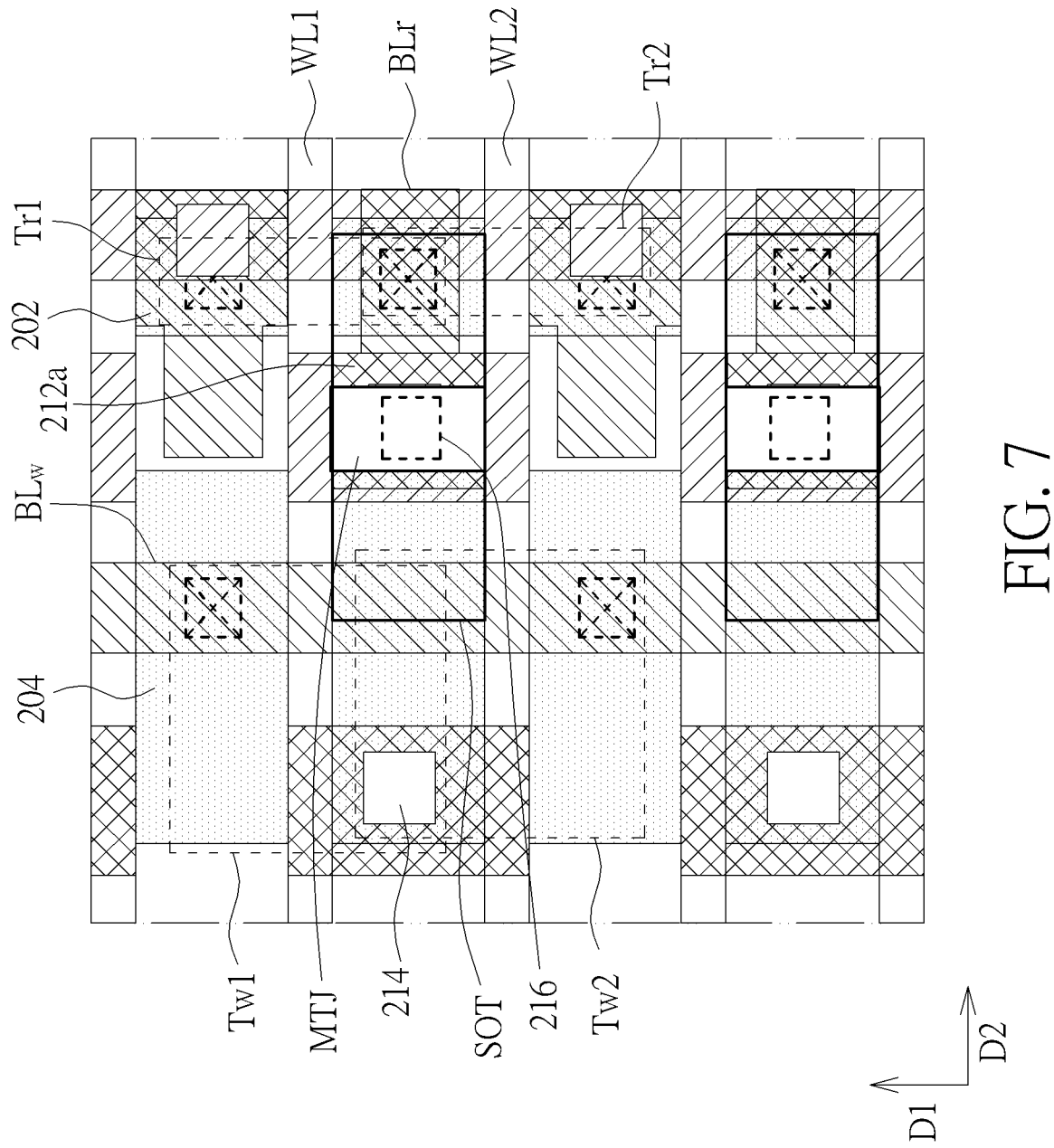

Please refer now to FIG. 7. With regard to the read transistors Tr1, Tr2, the common source of read transistors Tr1, Tr2 is connected to the second metal layer 212a (FIG. 6) sequentially through the contact 206a, the first metal layer 208 and the via 210a (FIG. 5). Structures like tungsten via 216, magnetic tunnel junction MTJ and spin-orbit torque layer SOT are set sequentially on the second metal layer 212a. The magnetic tunnel junction MTJ is connected with the second metal layer 212a below through the tungsten via 216 and directly contacts the overlying spin-orbit torque layer SOT, preferably the middle section of the spin-orbit torque layer SOT, so as to constitute the SOT-MRAM unit (i.e. 106 in FIG. 1) of the present invention. Furthermore, the magnetic tunnel junction MTJ is preferably set at a position between the read active area 202 and the write active area 204, while the spin-orbit torque layer SOT is set at a position between the word lines WL1, WL2 and extends in the second direction D2 to partially overlap the parts like read active area 202, write active area 204, read bit line BLr and write bit line BLw. In general, the aforementioned tungsten via 216, magnetic tunnel junction MTJ and spin-orbit torque layer SOT may be in the same level as the one of via 214.

Figure 8:
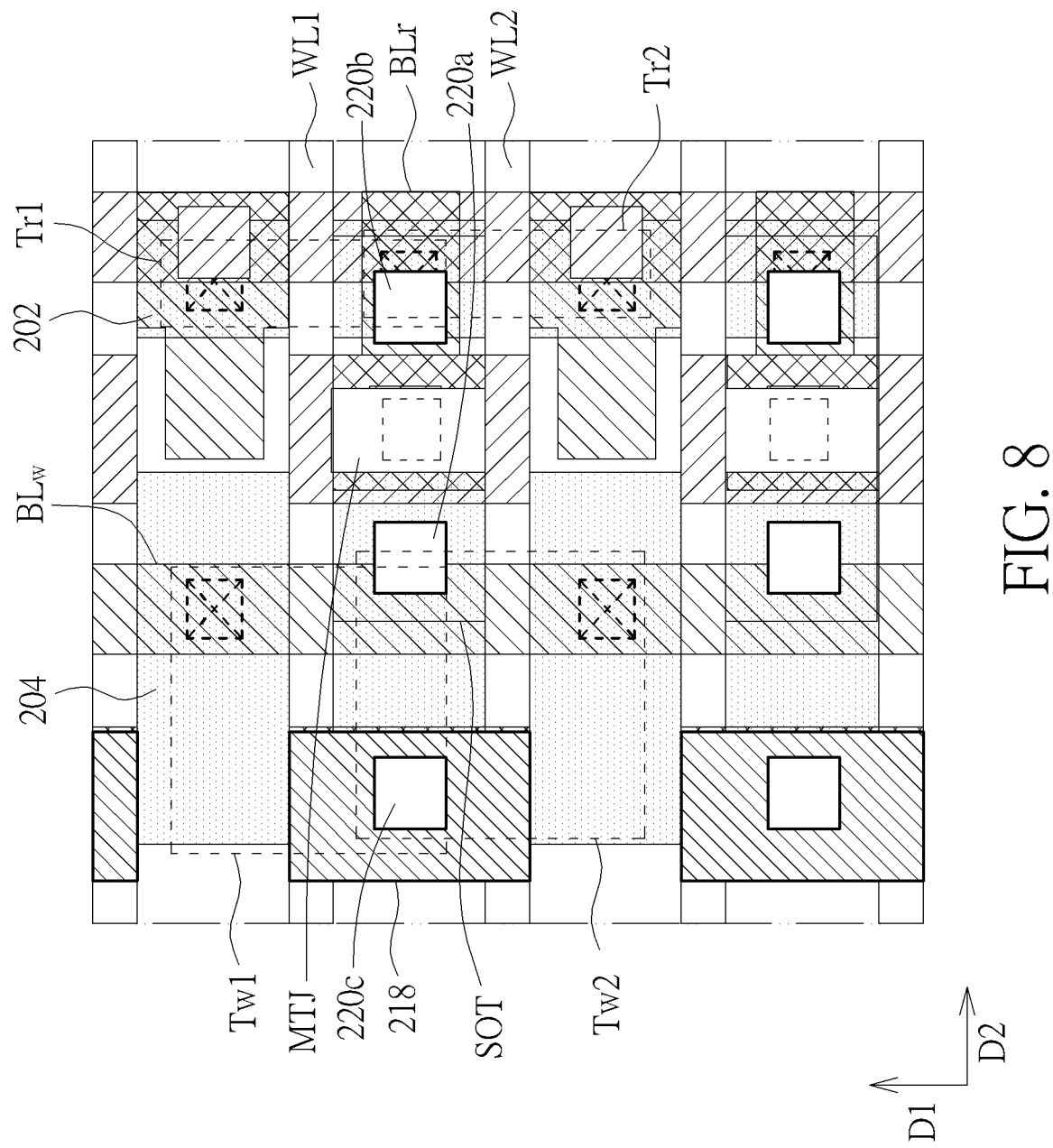

Please refer now to FIG. 8. Following the spin-orbit torque layer SOT in previous figure, vias 220a, 220b are set respectively on two ends of the spin-orbit torque layer SOT and are roughly symmetric in the second direction D2 with respect to the magnetic tunnel junction MTJ below, wherein the via 220a overlaps the write bit line BLw and the write active area 204 below, while the via 220b overlaps the read bit line BLr and the read active area 202 below. With regard to the write transistors Tw1, Tw2, the via 214 (FIG. 7) is connected to a third metal layer (M3) 218 above, wherein its plan pattern may completely overlap the underlying second metal layer 212b (FIG. 7). Another via 220c is further set on the third metal layer 218, wherein its plan pattern may completely overlap the via 214 (FIG. 7) and the via 210c (FIG. 5) below. The aforementioned vias 220a, 220b, 220c are all preferably set at positions between the word lines WL1, WL2. It can be seen in the figure that the read bit line BLr and the write bit line BLw are preferably symmetric in the second direction D2 with respect to the magnetic tunnel junction MTJ.

Figure 9:
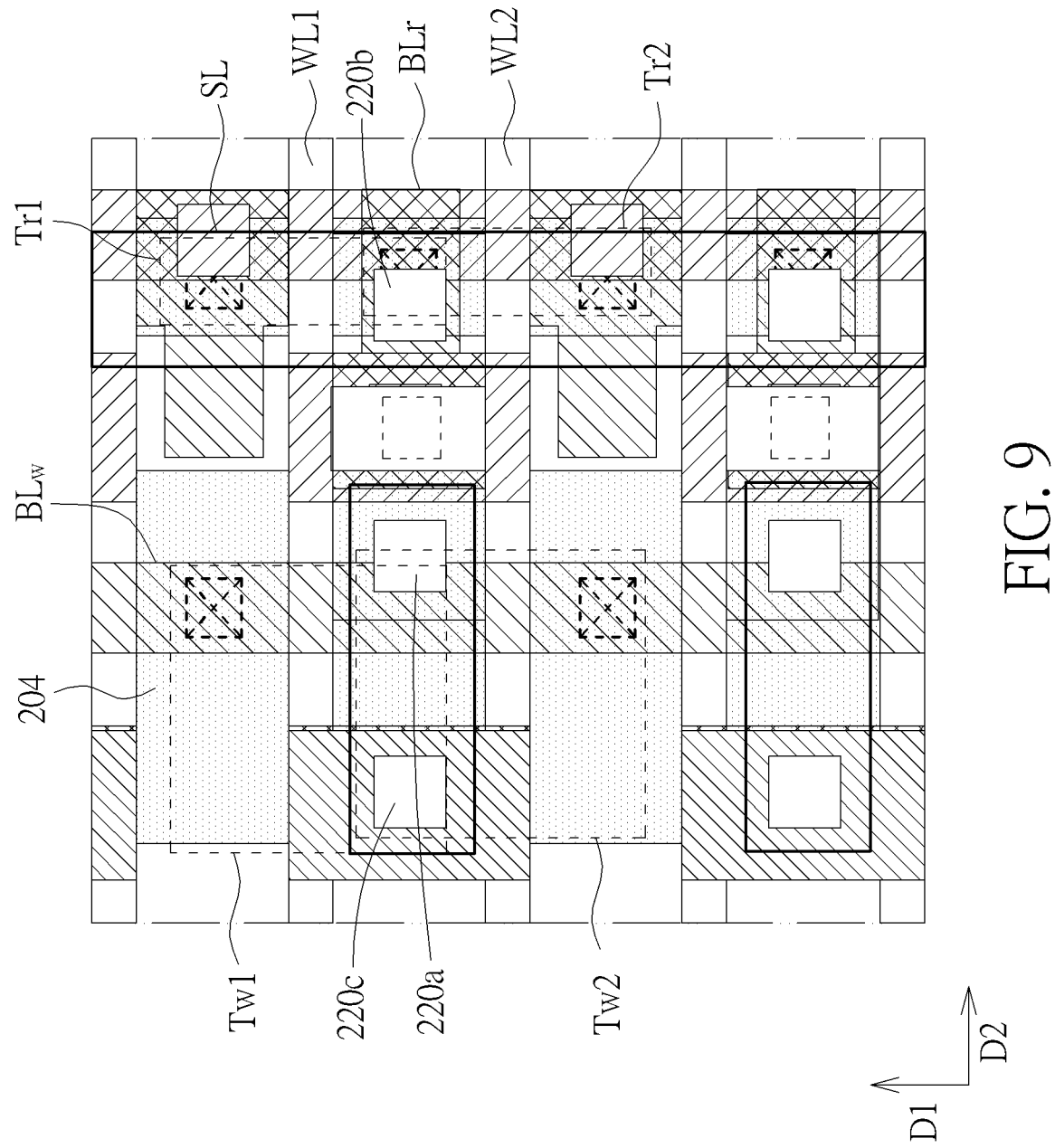

Lastly, please refer to FIG. 9. Following the aforementioned vias 220a, 220b, 220c, the via 220b on one end of the spin-orbit torque layer SOT connects with a source line SL above. In the embodiment of present invention, the source line SL extends in the first direction D1 and overlaps the read bit line BLr and the read active area 202 (FIG. 5) below. The via 220a on another end of the spin-orbit torque layer SOT connects with a bridge part 222 in an upper layer and is further connected to the via 220c of the write active area 204 through the bridge part 222. In the embodiment of present invention, the bridge part 222 is set at a position between the word lines WL1, WL2 and extends in the second direction D2, and it also roughly overlaps the write active area 204 and partially overlaps the spin-orbit torque layer SOT below.

Refer still to FIG. 9. It can be clearly understood through the aforementioned layout patterns that, in the embodiment of present invention, one end of the spin-orbit torque layer SOT of the SOT-MRAM is connected to the source line SL to form one terminal of the memory device, the other end of the spin-orbit torque layer SOT is connected to the write transistor pair and the write bit line BLw connected therewith to form another terminal of the memory device. Furthermore, the SOT-MRAM unit is connected downwardly to the read transistor pair and the read bit BLr line connected therewith to form the third terminal of the memory device.

In summary to the aforementioned embodiments, the SOT-MRAM circuit and layout thereof provided in the present invention features the 4T1M (four transistors and one memory unit) architecture, including a read transistor pair with two read transistors connected in parallel and a write transistor pair with two write transistors connected in parallel, so that required layout area may be reduced in the manner of sharing common drains. Furthermore, the read transistor pair and the write transistor pair are both provided with two drains connected to a common bit line for providing operating current, so that the memory unit may receive double operating current in comparison to the one in conventional skill, thereby solving the issue of inefficient current usage of the MRAM. In addition, the read active area and the write active area may have different width to provide design flexibility for layout and need not to form additional isolating word lines for isolating memory units.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A spin-orbit torque magnetic random access memory circuit, comprising:
   a read transistor pair with two read transistors in parallel;
   a write transistor pair with two write transistors in parallel;
   a spin-orbit torque magnetic random access memory unit with a magnetic tunnel junction and a spin-orbit torque layer, wherein one end of said magnetic tunnel junction is connected to a source of said read transistor pair and the other end of said magnetic tunnel junction is connected to said spin-orbit torque layer, and one end of said spin-orbit torque layer is connected to a source line and the other end of said spin-orbit torque layer is connected to a source of said write transistor pair;
   a read bit line connected to a drain of said read transistor pair;
   a write bit line connected to a drain of said write transistor pair;
   a first word line connected to a gate of one of said two read transistors and a gate of one of said two write transistors; and
   a second word line connected to a gate of another one of said two read transistors and a gate of another one of said two write transistors.

2. The spin-orbit torque magnetic random access memory circuit of claim 1, wherein in an operation of writing low state "0" data, an operation voltage is applied from said first word line and said second word line to open said read transistors and said write transistors, and an operation voltage is applied from said write bit line to said source line through said write transistor pair and said spin-orbit torque layer, and said read bit line is in high-resistance state.

3. The spin-orbit torque magnetic random access memory circuit of claim 1, wherein in an operation of writing high state "1" data, an operation voltage is applied from said first word line and said second word line to open said read transistors and said write transistors, and an operation voltage is applied from said source line to said write bit line through said spin-orbit torque layer and said write transistor pair, and said read bit line is in high-resistance state.

4. The spin-orbit torque magnetic random access memory circuit of claim 1, wherein in a read operation, an operation voltage is applied from said first word line and said second word line to open said read transistors and said write transistors, and an operation voltage is applied from said read bit line to said source line and said write bit line through said read transistor pair, said magnetic tunnel junction and said spin-orbit torque layer.

5. The spin-orbit torque magnetic random access memory circuit of claim 1, wherein said magnetic tunnel junction comprises a pinned layer and a free layer, and said free layer is connected with said spin-orbit torque layer.

6. The spin-orbit torque magnetic random access memory circuit of claim 1, further comprising a sense amplifier connected with said write bit line and said read bit line.

* * * * *